United States Patent
Symons et al.

(10) Patent No.: US 10,872,013 B2
(45) Date of Patent: Dec. 22, 2020

(54) NON VOLATILE MEMORY CONTROLLER DEVICE AND METHOD FOR ADJUSTMENT

(71) Applicant: Toshiba Memory Corporation, Tokyo (JP)

(72) Inventors: David Symons, Oxon (GB); Paul Hanham, Wiltshire (GB); Francesco Giorgio, Oxon (GB)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/354,526

(22) Filed: Mar. 15, 2019

(65) Prior Publication Data

US 2020/0293398 A1    Sep. 17, 2020

(51) Int. Cl.
| | | |
|---|---|---|
| *G06F 11/10* | (2006.01) | |
| *G11C 29/52* | (2006.01) | |
| *H03M 13/11* | (2006.01) | |
| *G11C 16/26* | (2006.01) | |
| *H03M 13/45* | (2006.01) | |
| *G11C 11/56* | (2006.01) | |
| *G11C 16/04* | (2006.01) | |

(52) U.S. Cl.
CPC .......... *G06F 11/1068* (2013.01); *G11C 16/26* (2013.01); *G11C 29/52* (2013.01); *H03M 13/1102* (2013.01); *H03M 13/45* (2013.01); *G11C 11/5621* (2013.01); *G11C 11/5671* (2013.01); *G11C 16/0483* (2013.01)

(58) Field of Classification Search
CPC .................................................. G06F 11/1068
USPC ........................................ 714/764, 763, 768
See application file for complete search history.

(56) References Cited

U.S. PATENT DOCUMENTS

| | | |
|---|---|---|
| 9,117,529 B2 | 8/2015 | Karakulak et al. |
| 9,235,467 B2 | 1/2016 | Micheloni et al. |
| 9,329,935 B2 | 5/2016 | Cohen et al. |
| 9,337,865 B2 | 5/2016 | Cohen et al. |
| 9,397,701 B1 | 7/2016 | Micheloni et al. |
| 9,407,294 B2 | 8/2016 | Hanham et al. |

(Continued)

OTHER PUBLICATIONS

Guiqiang Dong et al., "On the Use of Soft-Decision Error-Correction Codes in NAND Flash Memory," IEEE Transactions on Circuits and Systems-I: Regular Papers, vol. 58, No. 2, Feb. 2011, pp. 429-439.

(Continued)

*Primary Examiner* — Fritz Alphonse
(74) *Attorney, Agent, or Firm* — White & Case LLP

(57) ABSTRACT

There is provided a method of providing adjusted LLR values of a plurality of bits in a codeword to an LDPC decoder, the plurality of bits representing a plurality of charge states of a plurality of memory cells of a non-volatile memory. The method comprises storing in a non-volatile memory controller associated with the non-volatile memory LLR values of the plurality of bits. The controller then determines a plurality of levels of the charge states represented by the plurality of bits. The controller then generates, by a distribution processor, distributions of a population of the plurality of bits in the codeword at each of the plurality of levels at a first and a second time after the first time. The controller then generates the adjusted LLR values based on a comparison between the first and second distributions, and then decodes the codeword according to the adjusted LLR values.

28 Claims, 15 Drawing Sheets

(56) References Cited

U.S. PATENT DOCUMENTS

| | | |
|---|---|---|
| 9,450,610 B1 | 9/2016 | Micheloni et al. |
| 9,454,414 B2 | 9/2016 | Micheloni et al. |
| 9,576,671 B2 | 2/2017 | Karakulak et al. |
| 9,590,656 B2 | 3/2017 | Micheloni et al. |
| 9,720,754 B2 | 8/2017 | Karakulak et al. |
| 9,735,990 B2 | 8/2017 | Sugihara |
| 10,340,951 B2 | 7/2019 | Symons et al. |
| 2007/0183220 A1 | 8/2007 | Aritome |
| 2009/0113259 A1 | 4/2009 | Aritome |
| 2009/0303788 A1 | 12/2009 | Roohparvar et al. |
| 2011/0235414 A1 | 9/2011 | Ikeda et al. |
| 2011/0311002 A1* | 12/2011 | Li ............... H03M 13/1102 375/341 |
| 2012/0005551 A1* | 1/2012 | Gunnam ......... H03M 13/6306 714/752 |
| 2013/0145235 A1 | 6/2013 | Alhussien et al. |
| 2013/0185598 A1 | 7/2013 | Haratsch et al. |
| 2014/0281800 A1 | 9/2014 | Micheloni et al. |
| 2014/0281822 A1 | 9/2014 | Wu et al. |
| 2014/0281823 A1 | 9/2014 | Micheloni et al. |
| 2014/0281828 A1 | 9/2014 | Micheloni et al. |
| 2016/0006462 A1 | 1/2016 | Hanham et al. |
| 2016/0306694 A1 | 10/2016 | Tai et al. |
| 2017/0093428 A1* | 3/2017 | Yen .................. H03M 13/658 |
| 2017/0134193 A1 | 5/2017 | Sugihara |
| 2017/0236592 A1 | 8/2017 | Alhussien et al. |
| 2017/0255518 A1 | 9/2017 | Achtenberg et al. |
| 2017/0288699 A1 | 10/2017 | Yang et al. |
| 2017/0300252 A1 | 10/2017 | Yim et al. |
| 2018/0276072 A1 | 9/2018 | Kodama et al. |
| 2018/0287635 A1 | 10/2018 | Djurdjevic et al. |
| 2019/0245563 A1* | 8/2019 | Li .................. H03M 13/4138 |

OTHER PUBLICATIONS

Jonghong Kim et al., "Low-energy Error Correction of NAND Flash Memory Through Soft-Decision Decoding," EURASIP Journal on Advances in Signal Processing 2012, 2012:195, SpringerOpen Journal, pp. 1-12.

Aslam et al., "Read and Write Voltage Signal Optimization for Multi-Level-Cell (MLC) NAND Flash Memory", Apr. 2016, IEEE, vol. 64, No. 4, pp. 1613-1623 (Year: 2016).

* cited by examiner

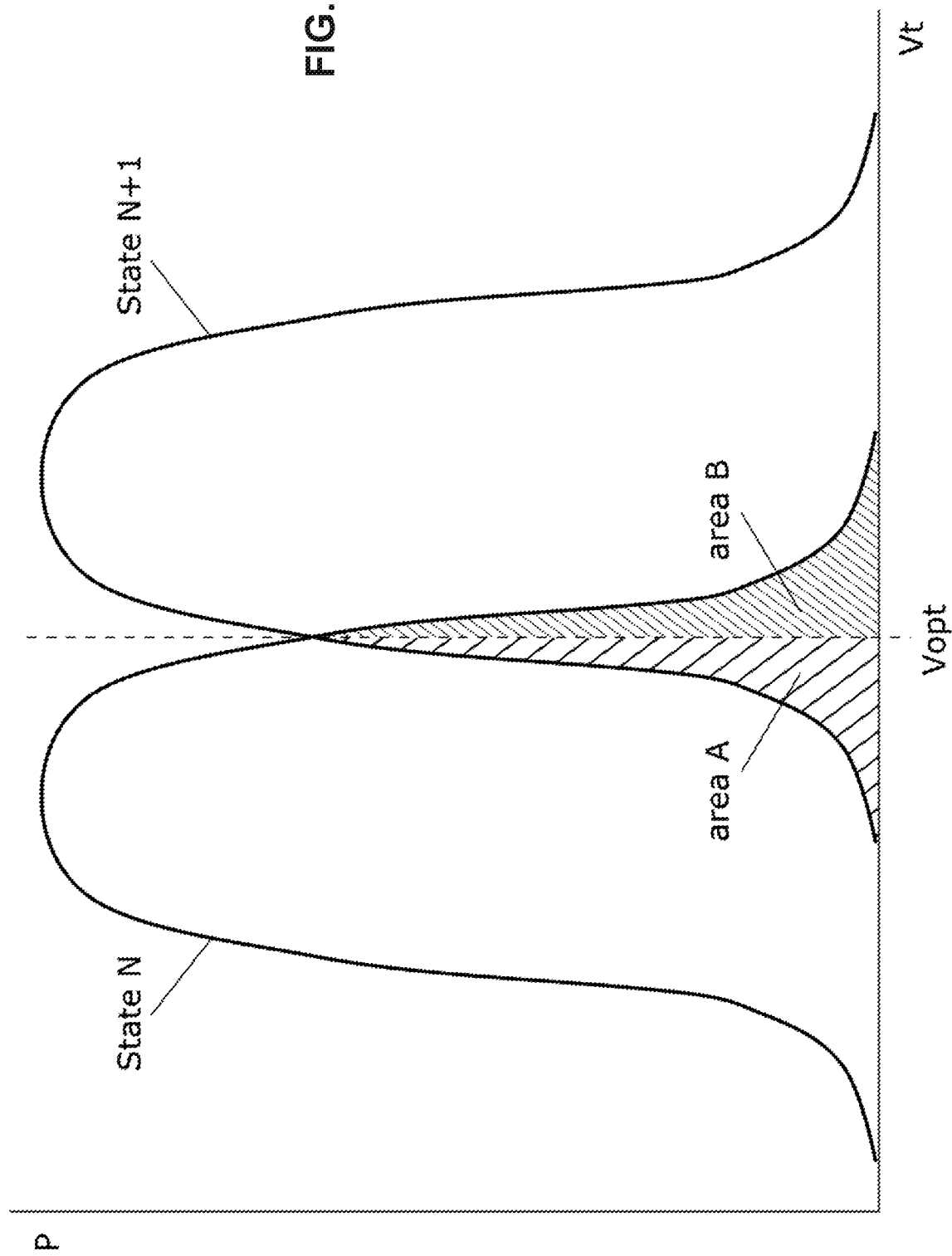

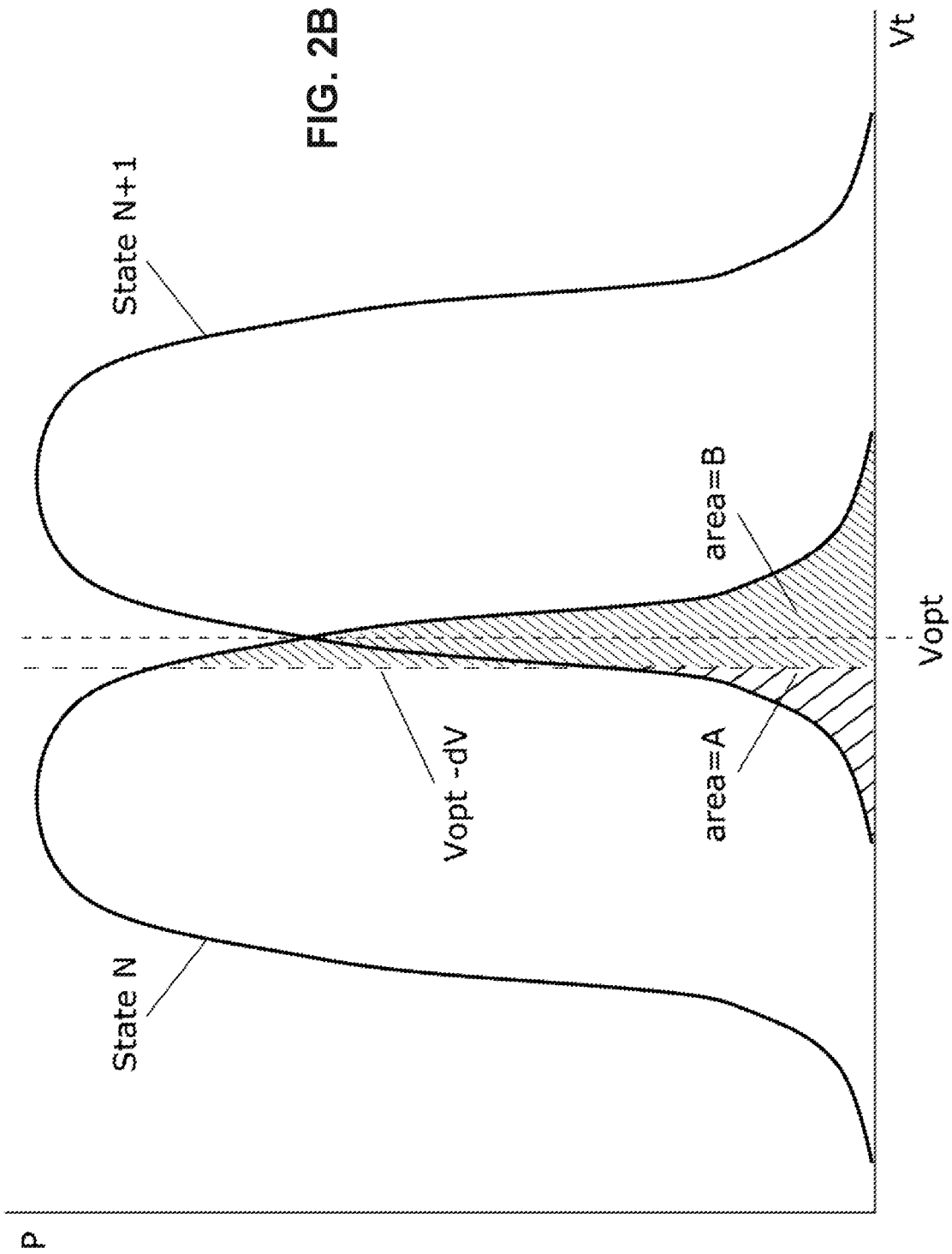

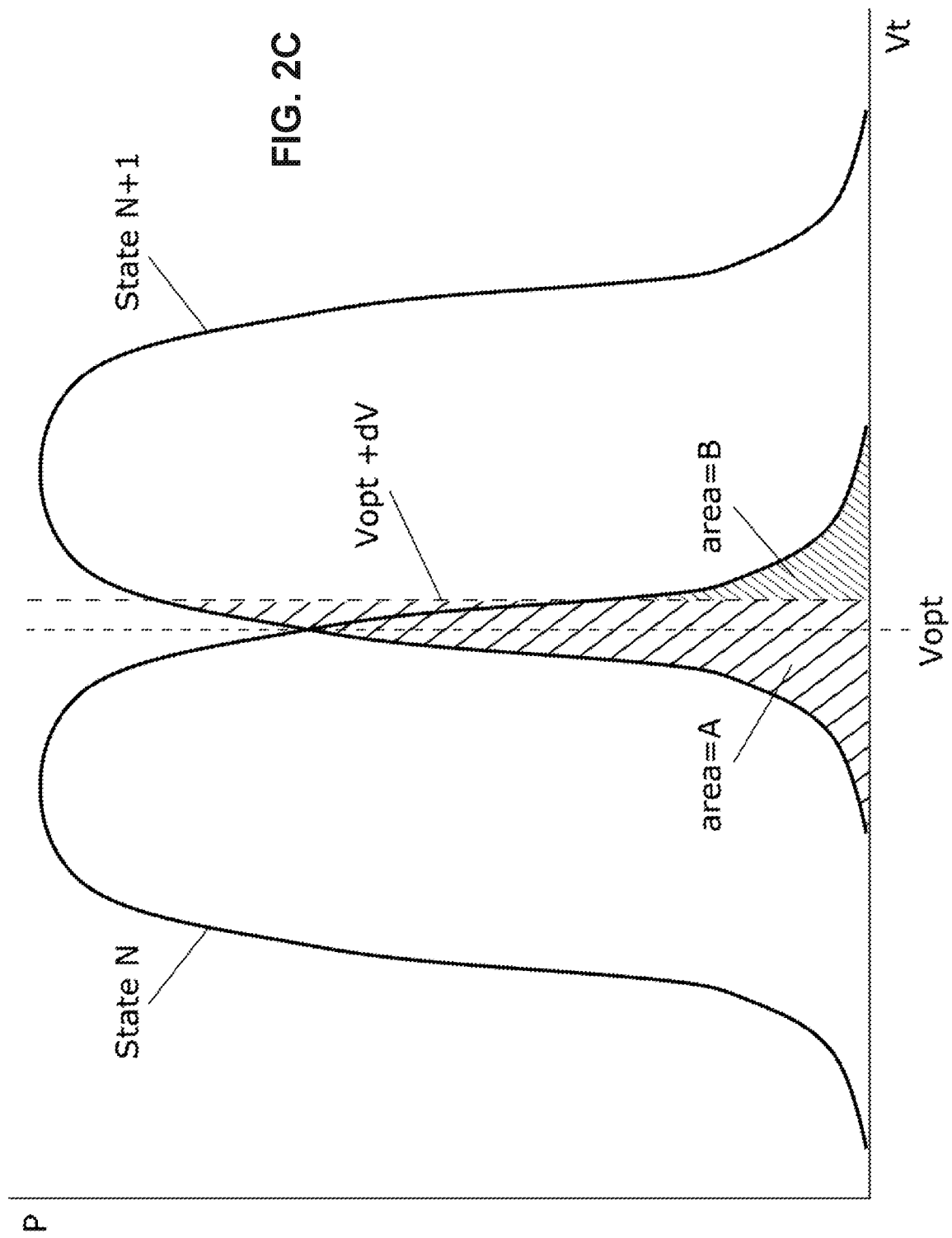

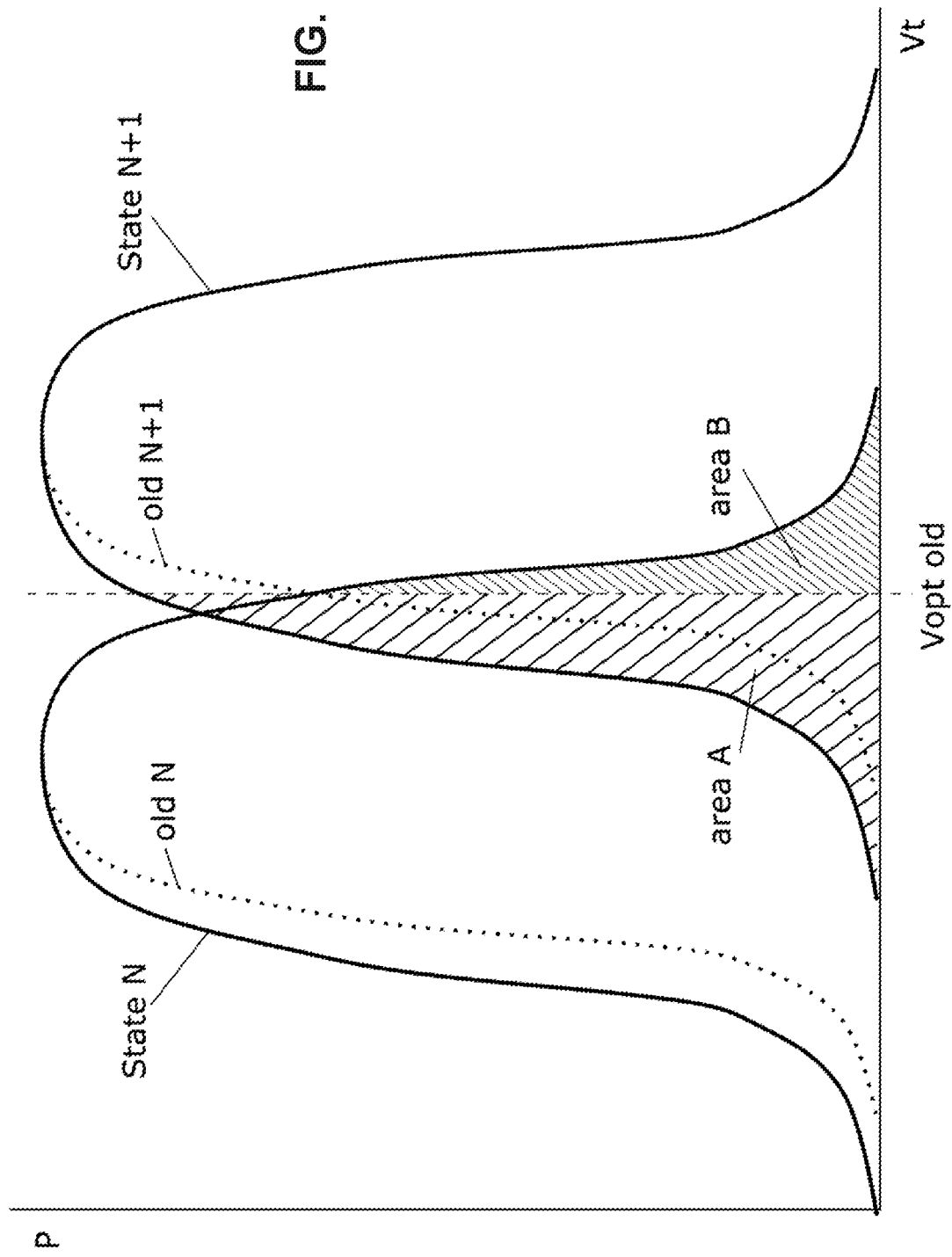

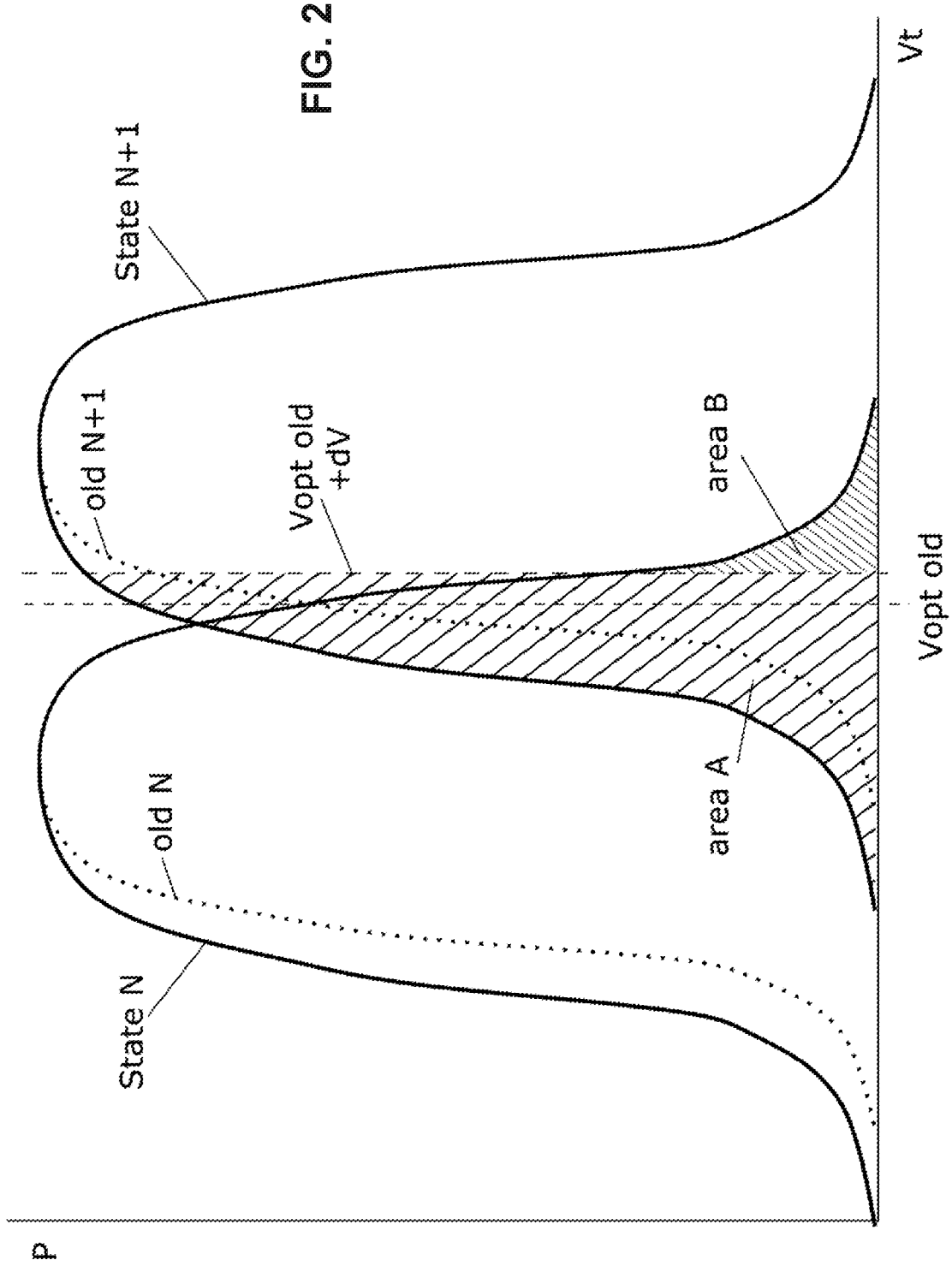

NON VOLATILE MEMORY CONTROLLER DEVICE AND METHOD FOR ADJUSTMENT

FIELD OF THE INVENTION

The present disclosure relates to solid-state storage device controllers and methods of providing one or more adjusted log likelihood ratio (LLR) values for Low Density Parity Check (LDPC) decoders.

BACKGROUND

Improvements in NAND flash memory technology have led to reduced solid state device geometries and increased bit density of nonvolatile NAND flash memories. This has lead to, accordingly, an increase in error rates of data decoded from such memories. One type of error correction code commonly employed in nonvolatile memory storage modules are low-density parity-check (LDPC) codes. In some embodiments, an LDPC code is a linear error correcting code having a parity check matrix with a small number of non-zero elements in each row and column.

For example, in single level cell (SLC) memory, two charge states represent the two possible states: '0' and '1', of the cells within the NAND device. In MLC memory, four charge states represent the 4 possible states: '00', '01', '10' and '11', TLC memory has eight charge states, and so on. When data is stored, charge programming variations cause the programmed charge state to be an analogue quantity which varies according to a statistical distribution rather than a discrete value. Further, charge distributions of different states of a memory cell may overlap and stored charge may drift over time.

Devices and methods for improving the accuracy of a log likelihood ratio (LLR) assigned to a bit of a codeword have been described in U.S. application Ser. No. 15/702,967, the entire contents of which are hereby incorporated by reference. The power of LDPC codes resides in the ability of the decoder to exploit so-called 'soft' information on the stored data. Reading soft information from the NAND memory array requires multiple reads at varying threshold voltages. However, over time the memory cells of the array would experience a threshold voltage shift due to factors such as, for example, (i) read and program disturb in which the memory cells neighboring those being read or programmed suffer a small programming effect, which increases as the number of reads or programs on pages increases, (ii) age of the device where charge retention deteriorates due to charge leakage, and (iii) number of program/erase cycles in which the memory cell structure becomes damaged and the charge distribution in the memory cell changes. When the threshold shift becomes too large, soft LDPC decoding would not be possible to obtain error free data on readout from the memory array. As such, there is a long-felt need to obtain adjusted LLR values to counter the effect of shifting threshold voltages to correctly read stored data from a non-volatile memory.

SUMMARY

Disclosed herein are approaches for addressing various problems and shortcomings of the state of the art, as identified above. More particularly, disclosed herein are methods and devices providing one or more adjusted log likelihood ratio (LLR) values to a low-density parity check (LDPC) decoder. In a first embodiment of the present disclosure, there is provided a method of providing one or more adjusted log likelihood ratio (LLR) values of a plurality of bits in a codeword to a low-density parity check (LDPC) decoder, the plurality of bits representing a plurality of charge states of a plurality of memory cells of a non-volatile memory. The method comprises storing in a non-volatile memory controller associated with the non-volatile memory one or more LLR values of the plurality of bits. The controller then determines, by translation circuitry, a plurality of levels of the plurality of charge states represented by the plurality of bits. The controller then generates, by a distribution processor, a first distribution of a population of the plurality of levels at a first time, and a second distribution of the population of the plurality of levels at a second time after the first time. The controller then generates, by an LLR generator, the one or more adjusted LLR values of the plurality of bits bit based on a comparison between the first and second distributions. The controller then decodes, by the LDPC decoder, the codeword according to the one or more adjusted LLR values.

In a second embodiment of the present disclosure, there is provided non-volatile memory controller for adjusting one or more log likelihood ratio (LLR) values of a plurality of bits in a codeword for low-density parity check (LDPC) decoding, the plurality of bits representing a plurality of charge states of a plurality of memory cells of a non-volatile memory. The controller comprises storing circuitry configured to store one or more LLR values of the at least one bit. The controller also comprises translation circuitry configured to determine a plurality of levels of the plurality of charge states represented by the plurality of bits. Further, the controller comprises a distribution processor configured to (i) generate a first distribution of a population of the plurality of levels at a first time, and (ii) generate a second distribution of the population of the plurality levels at a second time after the first time. Further, the controller comprises an LLR generator configured to generate the one or more adjusted LLR values of the plurality of bits based on a comparison between the first and second distributions. The controller also comprises an LDPC decoder configured to decode the codeword using the one or more adjusted LLR values.

In some implementations, the comparison comprises determining a minimum population in each of the first and second distributions, and the associated level at each minimum population, determining a difference between the associated levels for the first and second distributions, and determining a corrected LLR value for each bit in the codeword that minimizes the difference. In certain implementations, the one or more LLR values are stored in a first look up table (LUT), and wherein the one or more adjusted LLR values are stored in a second LUT. In other implementations, the first and second distributions comprise cumulative population distributions.

In some implementations, the level is a threshold voltage level associated with a charge state of a cell of the non-volatile memory. In certain implementations, the difference between the associated levels for the first and second distributions corresponds to a change in read threshold voltage of the cells of the non-volatile memory. In other implementations, determining the cell charge state of a cell comprises performing multiple reads on each cell at varying threshold voltages. In certain implementations, the plurality of cell charge states and their associated numerical levels are stored in the non-volatile memory controller. In other implementations, the level of a cell varies according to the cell charge state of plurality of cells.

In some implementations, the level of a cell varies according to a length of time since the cell was programmed with charge. In certain implementations, the level of a cell varies according to a total number of read cycles or program and erase cycles the target cell has been subjected to. In other implementations, the LLR values stored in the first and second LUTs are predetermined. In some implementations, the non-volatile memory comprises any one of: single level cells (SLCs), multi-level cells (MLCs), triple level cells (TLCs) and quadruple level cells (QLCs). In certain implementations, the plurality of cells of the non-volatile memory is capable of being in any one of two, four, eight or sixteen cell charge states.

BRIEF DESCRIPTION OF THE DRAWINGS

The foregoing and other objects and advantages will be apparent upon consideration of the following detailed description, taken in conjunction with the accompanying drawings, in which like reference characters refer to like parts throughout, and in which:

FIGS. 2A-2H illustrates the variation of threshold voltage for two consecutive charge states N and N+1 of a memory cell, according to one or more embodiments of the present disclosure;

DETAILED DESCRIPTION

To provide an overall understanding of the devices and methods described herein, certain illustrative embodiments will be described. Although the embodiments and features described herein are specifically described for use in connection with LDPC decoders in non-volatile memory cells, it will be understood that all the components and other features outlined below may be combined with one another in any suitable manner and may be adapted and applied to other types of memory devices in which an adjusted LLR value is required to cater to threshold voltage shifts.

Figure 1:
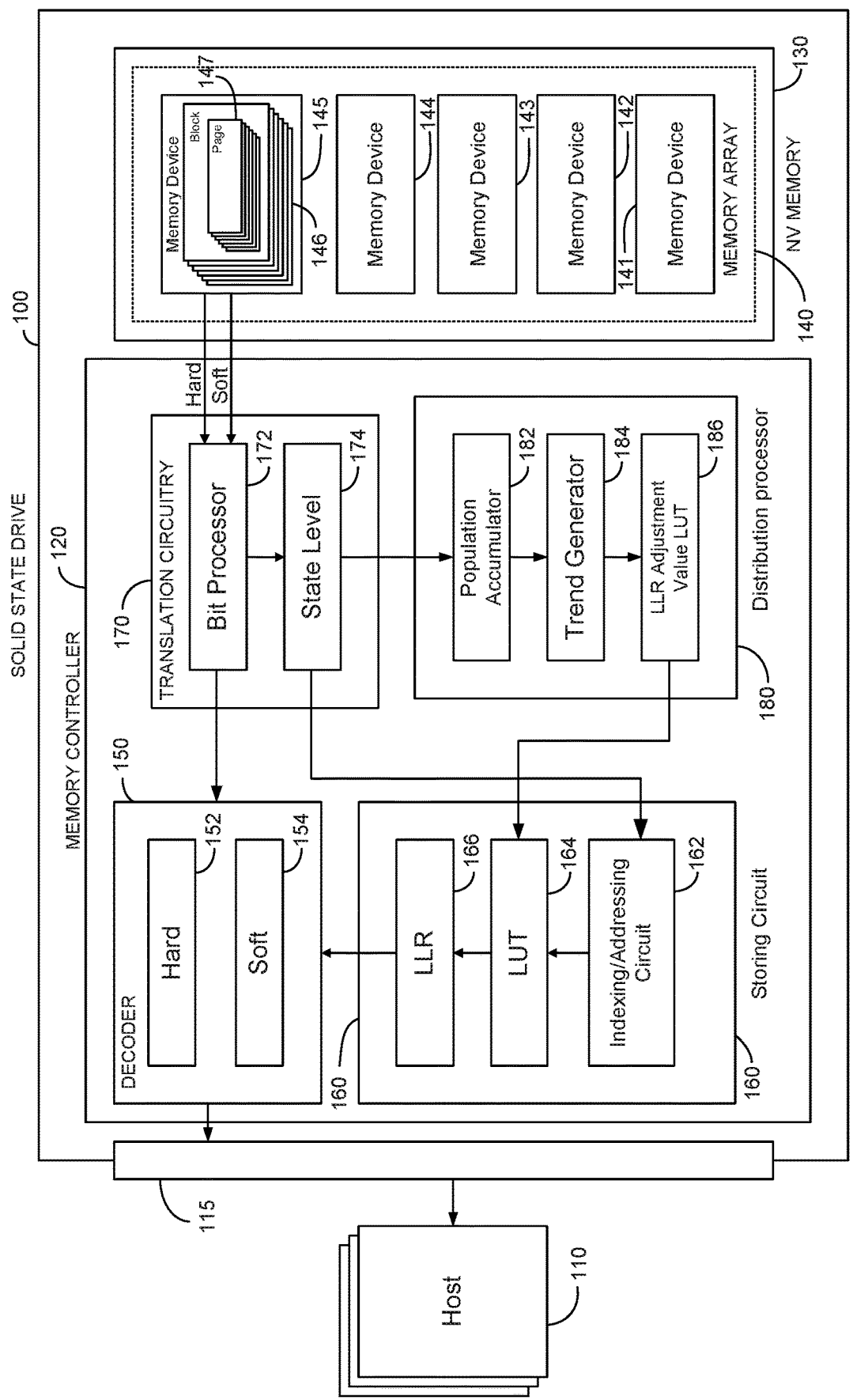
FIG. 1 shows a schematic representation of a solid-state drive (SSD), according to one or more embodiments of the present disclosure.

FIG. 1 illustrates a general solid state drive (SSD) 100 communicatively coupled to at least one host device 110 via an interface 115 (which may comply with SATA, SCSI, SAS, PCIe, NVMe or other protocols). In some embodiments of the present disclosure, the memory 100 may be a NAND flash memory. The SSD 100 comprises a memory controller 120 coupled to nonvolatile memory 130 comprising a memory array 140. Each memory array 140 may comprise a plurality of memory devices 141-145. While only one memory array 140 is depicted in FIG. 1, it will be understood that the memory controller 120 may comprise plurality of memory arrays similar to array 140. Each memory device 140 may comprise a plurality of memory blocks 146, each memory block may comprise a plurality of memory pages 147 and each memory page may comprise a plurality of memory cells (not shown for clarity). The memory controller 120 comprises an Error Correction Code (ECC) encoder/decoder such as a LDPC decoder 150. LDPC decoder 150 comprises a hard-decision LDPC decoder 152 and a soft-decision LDPC decoder 154. The decoder 150 receives as inputs log likelihood (LLR) values from a storing circuit 160 for at least one bit of a plurality of bits stored in the cells 141-145 of the memory array 140.

In certain embodiments, the memory controller 120 comprises storing circuitry 160 for storing at least one look-up table (LUT) 164 that operates with an indexing and addressing circuit 162. The storing circuitry 160 may be implemented as a set of registers or as RAM. Such LUTs 164 use at least one address bit from the nonvolatile memory 130 to access the information stored in the LUT 164. An exemplary LUT 164 may store LLR values 166 for each of the memory devices 141-145 of the memory array 140, or for each memory block 146, or for each memory page 147 or group of pages. Further, the LUT 164 may also use one or more index bits for accessing specific 'adjusted' LLR values 166 located in LUT 164 based on the output of the distribution processor 180, as will be described in the sections that follow.

In some embodiments, the memory controller 120 may also comprise translation circuitry 170 that receives hard bits and soft bits of data from the memory cell 141-145 in bit processor 172. It will be understood that while FIG. 1 illustrates that only memory device 145 is in communication with the bit processor 172, the remaining memory devices 141-144 are also in communication with the bit processor 172. The hard bits of data are provided to the hard decision decoder 152, while the soft bits of data are provided to the soft LDPC decoder 154. For each memory page 147 that is read, the bit processor 172 also determines the state level 174 of each of the cells in the memory page 147. The state levels are threshold voltage (Vt) levels which correspond to the level of charge in the memory cells.

The memory controller 120 may also comprise a distribution processor 180. The distribution processor 180 generates a population distribution of the state levels of cells stored in a memory page 147, each state corresponding to one of a plurality of regions of charge levels that cells of memory page 147 are able to be in. The regions of charge levels are defined by a number of reads of the memory cells being performed, known as 'soft reads', which provide more information than a simple 'hard read' of the memory, which only indicates whether the charge level of a cell is above or below the threshold used in the read operation (i.e. two regions of charge level). Soft reads involve additional read operations being performed with thresholds above and below a central hard read threshold. This allows the state level of the cells to be determined as being in regions the between the thresholds as well as being above the highest threshold and below the lowest threshold. A total of three soft reads provide four regions, five soft read provide six regions, and so on. Every two additional soft reads provide two additional regions.

The distribution processor 180 comprises a population accumulator 182, a trend generator 184 and a look up table (LUT) 186 for adjusted LLR values. The population accumulator 182 tallies the number of cells at a particular threshold voltage regions, while the trend generator 184 sorts through the tallied data from the population accumulator 182 and determines a statistical value from such data. Such a statistical value may comprise, but is not limited to, a minimum of a histogram representation of the tallied data. The adjusted LLR LUT 186 stores LLR values that relate to the statistical values determined by the trend generator 184. These LLR values are obtained from the LLR LUT 164.

To read data stored in any memory page 147 of memory device 141-145, a voltage threshold is applied to determine in which charge state each memory cell of the memory page 147 lies, providing a binary result (above or below the threshold). A single threshold suffices for SLC to provide a 0/1 result and for MLC and TLC results from multiple thresholds provide multiple bits. To determine more accurate information on the charge state in a memory cell, further reads known as 'soft reads' provide extra bits of soft information which are expressed by the LLR which the LDPC decoder 150 can make use of to perform decoding. The LLR attributed to a bit is representative of the probability that the charge state value read corresponds to a '0' or a '1,' and the decoding performance of the soft decision LDPC decoder 154 depends on the accuracy of the LLR values.

In a general implementation, upon receipt of a write command from a host device 110, an LDPC encoder (not shown) encodes data d transmitted from the host device 110 to the SSD 100 prior to storing the encoded data in the nonvolatile memory 130. In order to encode the data, the encoder uses a generator matrix G to produce a codeword c, where c=Gd. The codeword is then stored as bits in memory array 140 of the nonvolatile memory 130. Upon receipt of a read command from a host device 110, a codeword c' is retrieved from the memory array 130. The codeword c' contains information related to the requested data in the read command. The retrieved codeword c' received by the controller 120 generally corresponds to an altered version of the codeword c output by the encoder due to the presence of errors. The retrieved codeword c' is input into the decoder 150 where the decoder uses a parity check matrix H and an LDPC decoding scheme iteratively to reduce the errors in the requested data d. However in some cases, due to the number of reads on a memory cell, the age of the memory cells, and the number of program/erase cycles, the charge states of memory cells may shift, meaning that read threshold voltages are incorrect. When this occurs, LLR values for the bits in the codeword which are attributed assuming correct threshold voltages will no longer be correct. When this occurs, the decoder parity matrix H may not be able to obtain the requested data d due to the high frame error rates (FER) involved thereby failing to correct all the errors in the decoded data.

According to an embodiment of the present disclosure, the distribution processor 180 of FIG. 1 utilizes population distributions of the levels of the charge states in the memory array 140 to ascertain if the threshold voltage of cells in memory pages 147 in the memory blocks 146 of the memory devices 141-145 of the memory array 140 have changed over time. The development of population distributions of the levels of the charge states of cells in a memory page will now be discussed with respect to FIGS. 2A-2H. It will be understood that FIGS. 2A-2H relate to the threshold voltages and charge states in one memory cell, and that each memory cell in the memory page 147 may exhibit similar characteristics. There may be variations in characteristics between different pages in a memory block 146, between different memory blocks 146 of a memory device 145 and also between different memory devices 141-145. In addition, these differences may change over time as the effects of reading, programming, erasing and data retention will vary over time for each page, block and device of the memory array 140.

FIG. 2A illustrates a probability distribution for two adjacent programmed charge states in a memory cell such as any one of the memory cells in memory devices 141-145 in FIG. 1. The two adjacent states are state N and state N+1. The horizontal axis represents the threshold voltage applied to the cell and the vertical axis is the probability that the cell in its programmed state has that threshold voltage. When a cell is first programmed with a given charge, there may be some variability in the actual charge, which may be above or below a nominal charge value for the memory cell. Such a probability distribution is often modelled as a normal distribution, as shown in FIG. 2A, with a characteristic symmetrical bell shaped curve or lobe. However, it will be understood that within the scope of the present disclosure such probability distributions can take on any form and may not adopt a symmetrical bell shaped curve as illustrated.

The two probability curves in FIG. 2A are shown superimposed. The left hand curve is for the cell programmed in charge state N and the right hand curve is for a cell programmed in the adjacent charge state N+1. In order to read the memory cell to determine if the cell is in state N (or any other state to the left of state N), or state N+1 (or any other state to the right of state N+1), a threshold voltage Vt would be applied to the cell. This threshold voltage would be between state N and state N+1. The optimal threshold voltage Vopt is one which minimizes the probability that a cell programmed to state N will be mistaken for being in state N+1, or vice-versa. At the same time, the optimum threshold voltage is also one in which the area A under the left hand tail of the curve for state N+1, which is the left of Vopt, is equal to the area B under the right hand tail of the curve for state N, which is to the right of Vopt. Area A represents the cumulative probability that a cell programmed to state N+1 will be (incorrectly) determined to be in state N, and area B represents the cumulative probability that a cell programmed to state N will be determined to be in state N+1. As the actual threshold voltage Vt moves away from the optimum Vopt, the area A will increase and area B decrease, or vice versa. Thus, the optimum threshold voltage Vopt is selected such that areas A and B are equal, thereby balancing the conflicting probabilities.

FIG. 2B illustrates the effect of using a threshold voltage which is less than optimum threshold voltage Vopt by an amount dV. In this situation, the area A (under the left hand tail of the curve for state N+1) reduces, while the area B (under the right hand tail of the curve for state N) increases. However, area B increases by a greater amount than the reduction in area A, such that overall area (the summation of areas A and B), i.e. the probability of an error in reading the cell, increases. Similarly, FIG. 2C illustrates the effect of using a threshold voltage which is greater than Vopt by an amount dV. In this case, the area B reduces, while the area A increases by a greater amount, such that overall area (i.e. the summation of areas of A and B), and hence the probability of an error in reading the cell, increases. Thus from FIGS. 2B and 2C, it can be seen that for symmetrical probability distributions, the probability that an error occurs during a read operation will be minimized when area A and area B are equal.

FIG. 2D illustrates the effect of the charge distributions changing, for example by charge leaking from the cell over time, or due to multiple read and write cycles, where the resulting probability distributions for each of states N and N+1 drift to the left. The previous old distributions are shown as dotted lines for comparison. In this situation, a previous optimal threshold voltage Vopt_old now becomes sub-optimal, where area A is very much greater than area B. FIG. 2D shows that even a small drift in charge can cause a large increase in read errors as seen from the enlargement of area A (cumulative probability that a cell programmed to state N+1 will be deemed to be in state N).

Figure 2E:
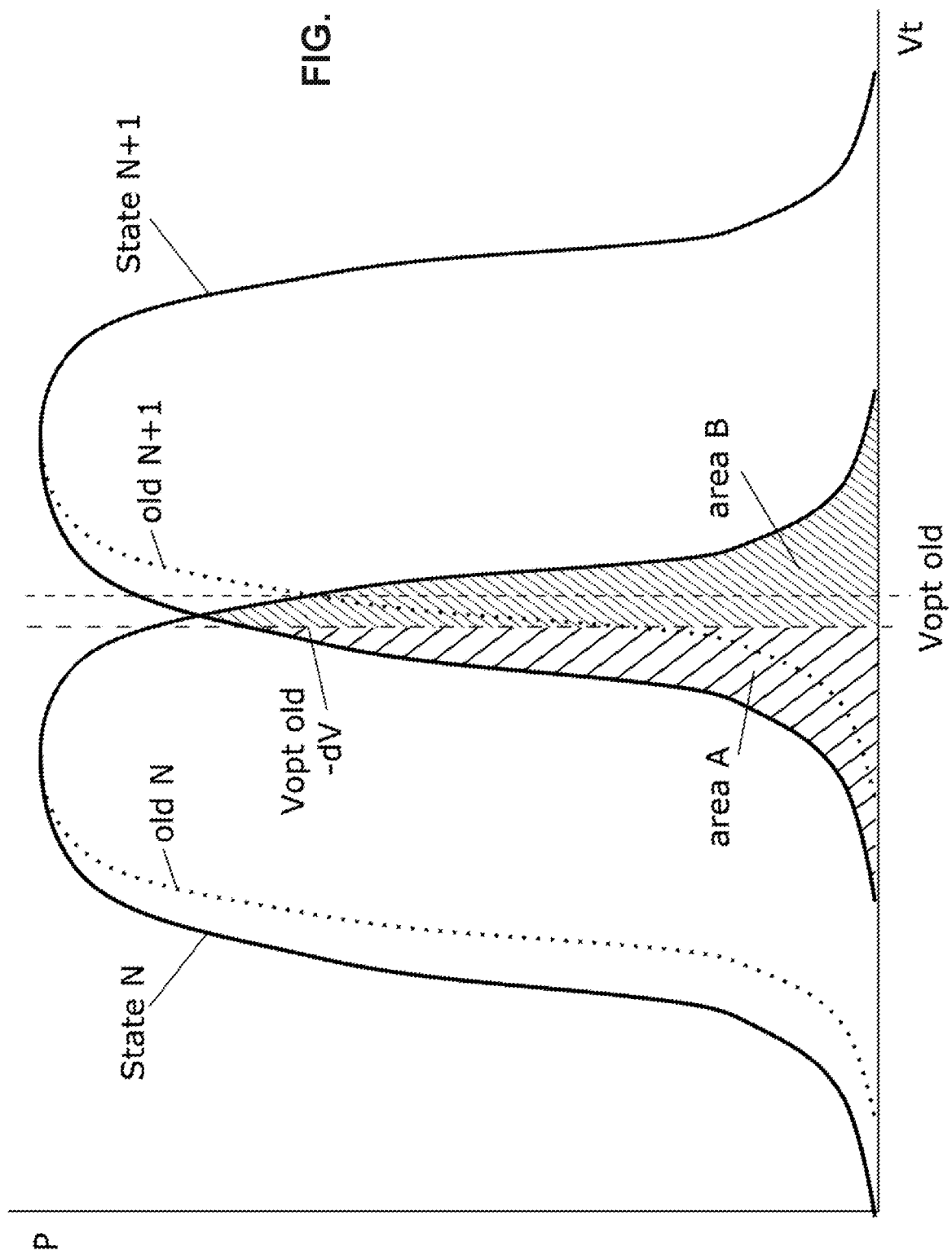

In order to compensate for the effect of changing charge distributions, a threshold voltage is applied that is equivalent to the previous optimal threshold voltage Vopt_old reduced by dV, as shown in FIG. 2E. This results in area B exceeding area A, however by only a small amount. However if the applied threshold voltage is increased by dV from the previous optimum Vopt_old, this would result in area A now exceeding area B by a large amount, as shown in FIG. 2F. Thus, from FIGS. 2E and 2F, it follows that the new optimum voltage must lie somewhere between (Vopt_old−dV) and (Vopt_old). It also follows that when charge distributions drift, the same threshold voltage changes (+/−dV) above and below the previous optimum voltage do not cause symmetrical changes in the read errors.

Figure 2G:
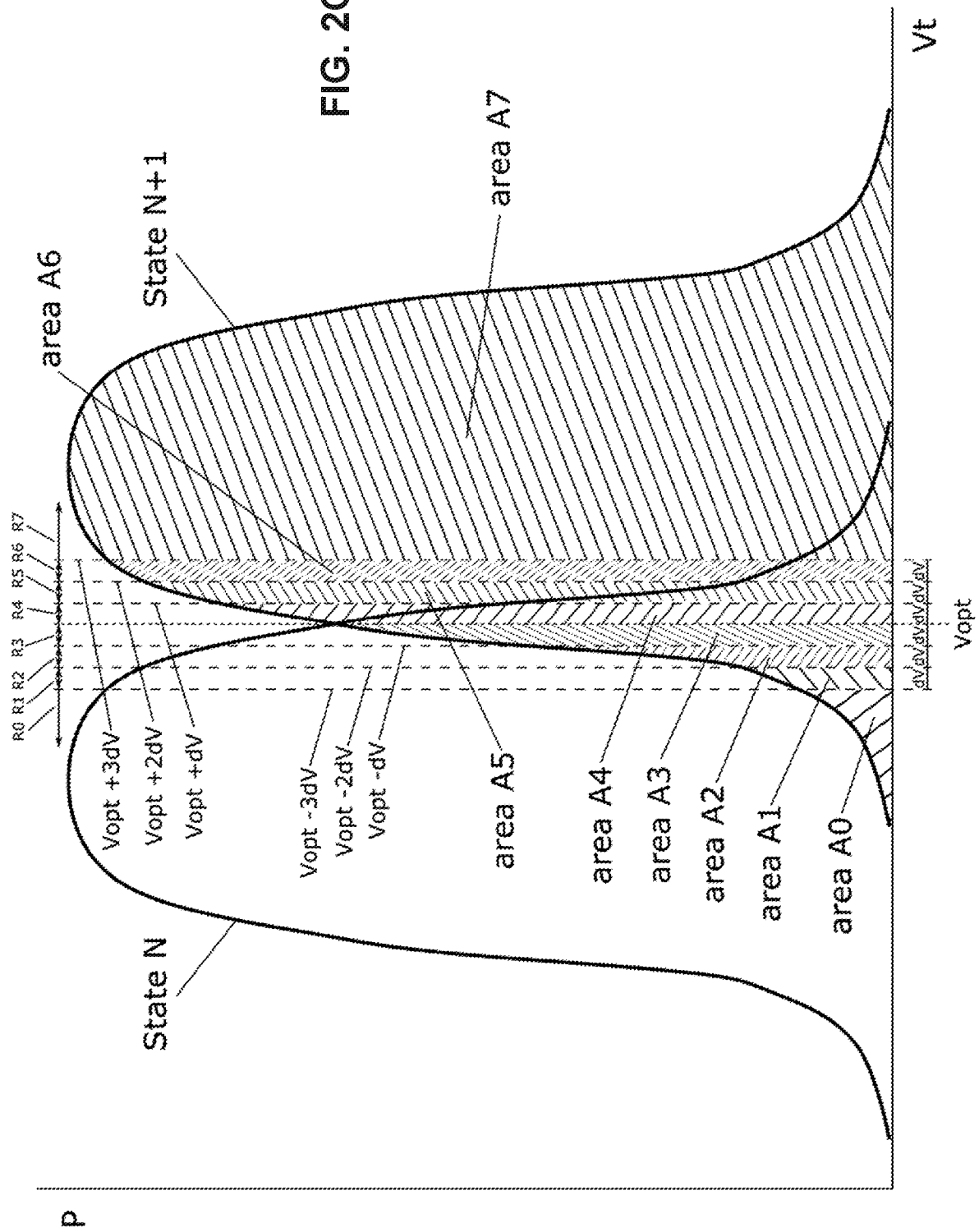
Figure 2H:
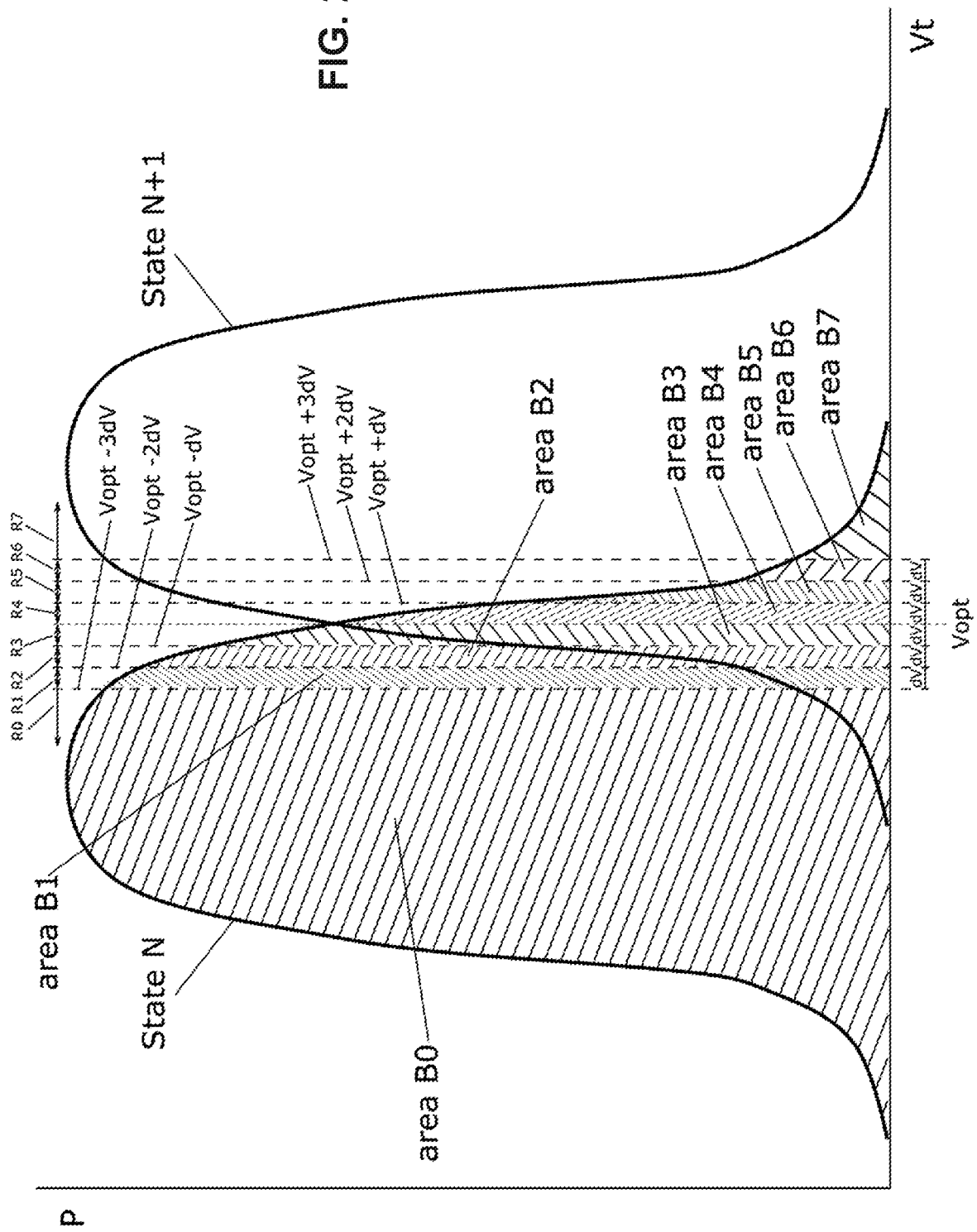

FIG. 2G illustrates the generation of population distributions of the levels of the charge states in the memory cells according to an embodiment of the present disclosure. The optimum read threshold voltage Vopt is the hard read threshold voltage. Data read using such hard reads would be used by the hard decoder 152 in FIG. 1. FIG. 2G also shows six additional soft read threshold voltages, spaced by an offset voltage of dV, 2dV and 3dV above and below Vopt. This gives rise to eight voltage level regions R0-R7 at which the charge stages of the memory cells may be operating. Recall that each of the bell shaped curves represents the probability that the memory cell in its programmed state has that threshold voltage. Thus, FIG. 2G shows the corresponding populations of state N+1 at each of level regions R0-R7. These populations are represented by areas A0-A7 under the curve for state N+1. Similarly, FIG. 2H shows corresponding populations of state N at level regions R0-R7 as defined above, represented by areas B0-B7. The population for each state for each level region Ri of levels R0-R7 is therefore the sum of area Ai and area Bi. Thus, Population (Ri)=Ai+Bi, generates the population distribution of each of the levels of the charge states in the memory cells.

As discussed in the foregoing, a LDPC soft decoder uses soft information read from the memory cells and uses this to attempt to correct all the errors in a codeword. The set of soft data is composed of data from a hard bit read which uses an optimum threshold voltage positioned between two of the lobes in the probability distribution so as to minimize the Bit Error Rate (BER), along with multiple soft bit reads at threshold voltages above and below the optimum. The soft reads individually provide hard bit data, but collectively they may be combined to form soft information, which indicates in which level region around the optimum threshold the state of charge in the cell most likely lies. As seen in FIGS. 2G and 2H, soft reads use positive and negative dV shifts relative to the threshold voltage used in the hard read to provide soft information for each of the bits in the codeword. Hard reads may also be used to identify which of the lobes in the distribution a particular bit in the codeword may be located. According to an embodiment of the present disclosure, dV is taken as 20 mV, however any voltage shift may be used.

Figure 3:
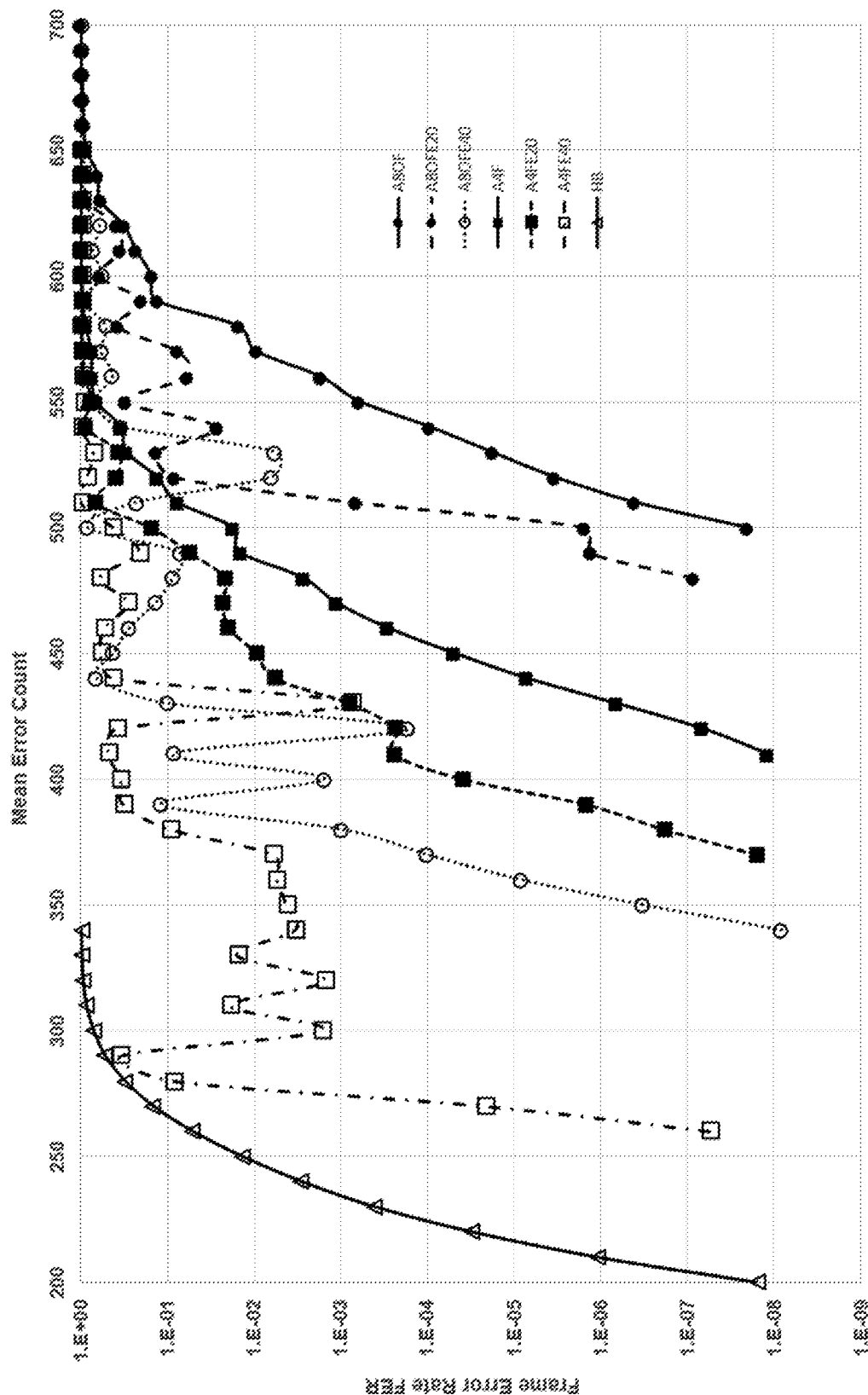
FIG. 3 shows data representative of the frame error rate (FER) of a soft decoder and its susceptibility to errors in threshold voltage, according to one or more embodiments of the present disclosure.

FIG. 3 shows the variation of Frame Error Rate (FER) with mean error count of a soft LDPC decoder. Line plot labelled 'A8OF' corresponds to memory cells having an optimal threshold voltage Vopt. Line plots labelled 'A8OFE20' and 'A8OFE40' have a threshold voltage error shift of 20 mV and 40 mV applied to Vopt. As seen from FIG. 3, the correction performance of the LDPC decoder with errors in the threshold voltage is worse than in the case where the threshold voltage is at Vopt. However the soft data read from the memory cells still contains useful information even if the threshold voltage has shifted from its optimum value.

Figure 4:
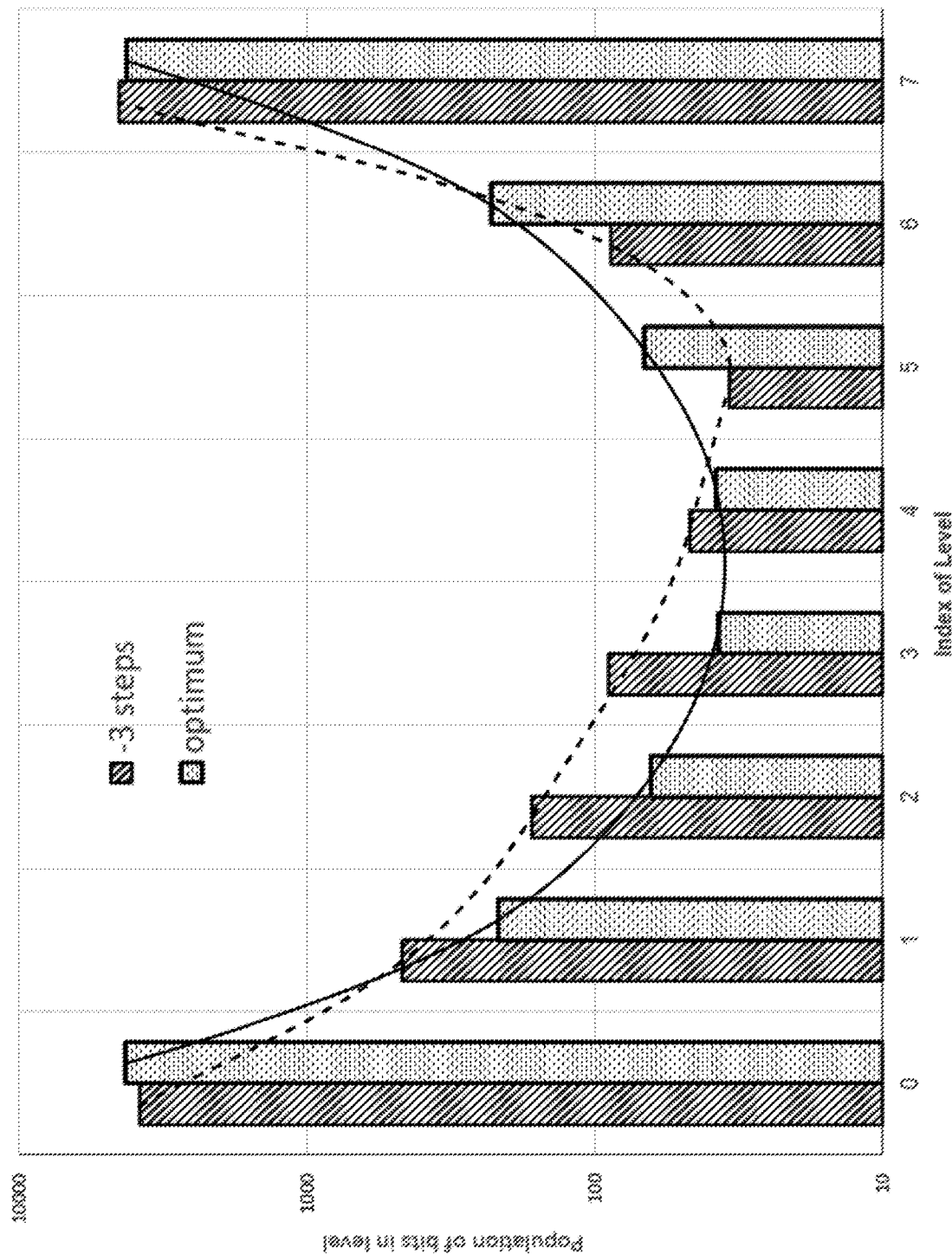
FIG. 4 shows the distribution of the population of the plurality of bits in a codeword at a plurality of levels in a memory cell with a given threshold voltage, according to one or more embodiments of the present disclosure.
Figure 5:
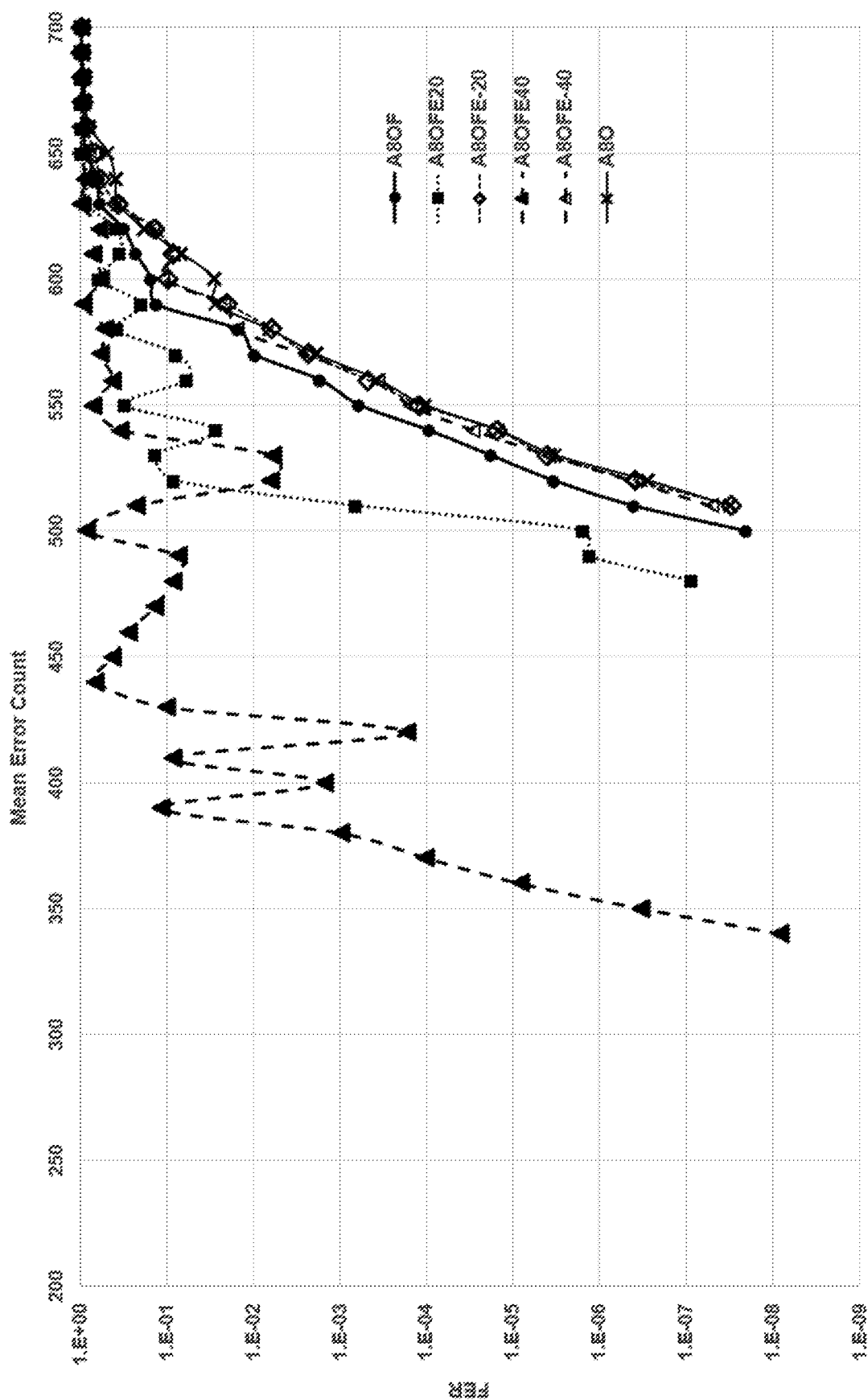
FIG. 5 shows data representative of the FER of a soft decoder with variations in threshold voltage corrected by adjusted LLR values, according to one or more embodiments of the present disclosure.

When the set of soft data includes all the other cells in a page then there is sufficient information to identify the optimum threshold point (see FIGS. 2A-2H above). A distribution plot of the populations of the cell charge levels in each of the regions around the central voltage threshold would clearly indicate if there has been an error in determining the read voltage using the tracking mechanism of the LDPC decoder. Such a distribution plot is exemplified as a histogram in FIG. 4, although it will be appreciated that any distribution plot may be used within the scope of the present disclosure. Exemplary distribution plots may include, but are not limited to, a frequency curve, a scatter plot, and a bar graph. It will be understood that while the memory cell characteristics discussed with respect to FIGS. 2A-2H are in relation to one memory cell, such as any of memory cells of memory devices 141-145 in FIG. 1, population distribution plots of charge states relate to a cumulative tally of all memory cells having a particular charge state (in a single page, groups of pages, pages in a block). Referring to FIG. 4, the points labelled optimum indicate the population of codeword bits in each of the level regions associated with the read for a data page when the read voltage is in its optimum position. The populations of the levels close to the read voltage are the smallest and the populations look symmetrical about this central point. FIG. 4 also shows points labelled−3 steps, which are the level populations where the central read threshold voltage has been positioned three quantization steps from the optimum threshold voltage (see FIGS. 2G and 2H). A quantization step is a small increase or decrease in voltage from the threshold voltage. In some implementations, each quantization step may be 20 mV (as indicated in FIG. 3). For this plot, FIG. 4 shows that the lowest level population is not adjacent to the optimum read voltage and the populations are not symmetrical. The asymmetry of the histogram indicates that the LLR LUT for the soft decoder should be adjusted when there are errors in the cell threshold voltage so as to compensate for the shift in population.

This histogram could therefore be used to adjust the values in the LLR LUT so that the values assigned for each bit more accurately track the actual probability of the bit after taking into account a shift in the optimum threshold voltage of the memory cells. Such a compensation adjustment in LLR values is shown in Table 3. After a threshold shift has occurred in the cells, the LLR values used for decoding are adjusted so as to compensate and take into account the shift in cell threshold voltage from Vopt to Vopt±3dV. These adjusted LLR values are determined by an LLR generator within the controller of the non-volatile memory. Without using such adjusted LLR values to cater to the shift in the threshold voltage, the performance of the LDPC decoder would be inferior and there would be a large number of errors in soft LDPC decoding.

According to the foregoing disclosure, the LDPC decoder would read in the soft data and use an "LLR Measurement mode" to generate a histogram for the populations in each of the levels as seen above. The generated histogram would then be used to adjust the values in the LLR LUT based on the features of the histogram. These adjusted LLR values can be obtained by using an adjusted pointer to the LUT such that it points to an adjusted LLR value, or the LLR value can be determined using an algorithm. The soft data is presented to a soft LDPC decoder for decoding. This would greatly increase the performance of the LDPC decoder if the read voltages have significant amounts of error.

TABLE 3

Original and adjusted LLR values at each level.

| Level Index | LLR for Optimum Vt | LLR for Vt shifted by 3 quantisation steps |
|---|---|---|
| 0 | −97 | −99 |
| 1 | −50 | −64 |
| 2 | −26 | −46 |
| 3 | −9 | −31 |
| 4 | 8 | −16 |
| 5 | 25 | 0 |
| 6 | 48 | 19 |
| 7 | 97 | 64 |

In addition to providing compensation for shifts in the optimum threshold voltage for data being read from a page, adjustments may be made to the threshold voltage if it has found to have drifted too far from the optimum to make accurate compensation adjustments via the LLR LUT values. Alternatively, data may be accumulated from multiple reads of the page, or a group of pages in a memory block, or all the pages in a memory block in order to provide averaged or more accurate data. Individual read threshold voltages may apply to individual pages in a block, or to groups of pages in a block, or to all pages in a block. A particular memory device may begin with the same read threshold voltage for all blocks and pages within the device, but then may have different threshold voltages applied to blocks, groups of pages and individual pages as reading and programming of pages, erasing of blocks and the retention time of data progresses. Therefore, the devices and methods described herein provide for automatically adjusting for shifts in memory cell voltage threshold at the time of reading memory pages, but also to subsequently adjust read voltage thresholds to improve reliability of reading of memory pages in the future.

Figure 6:
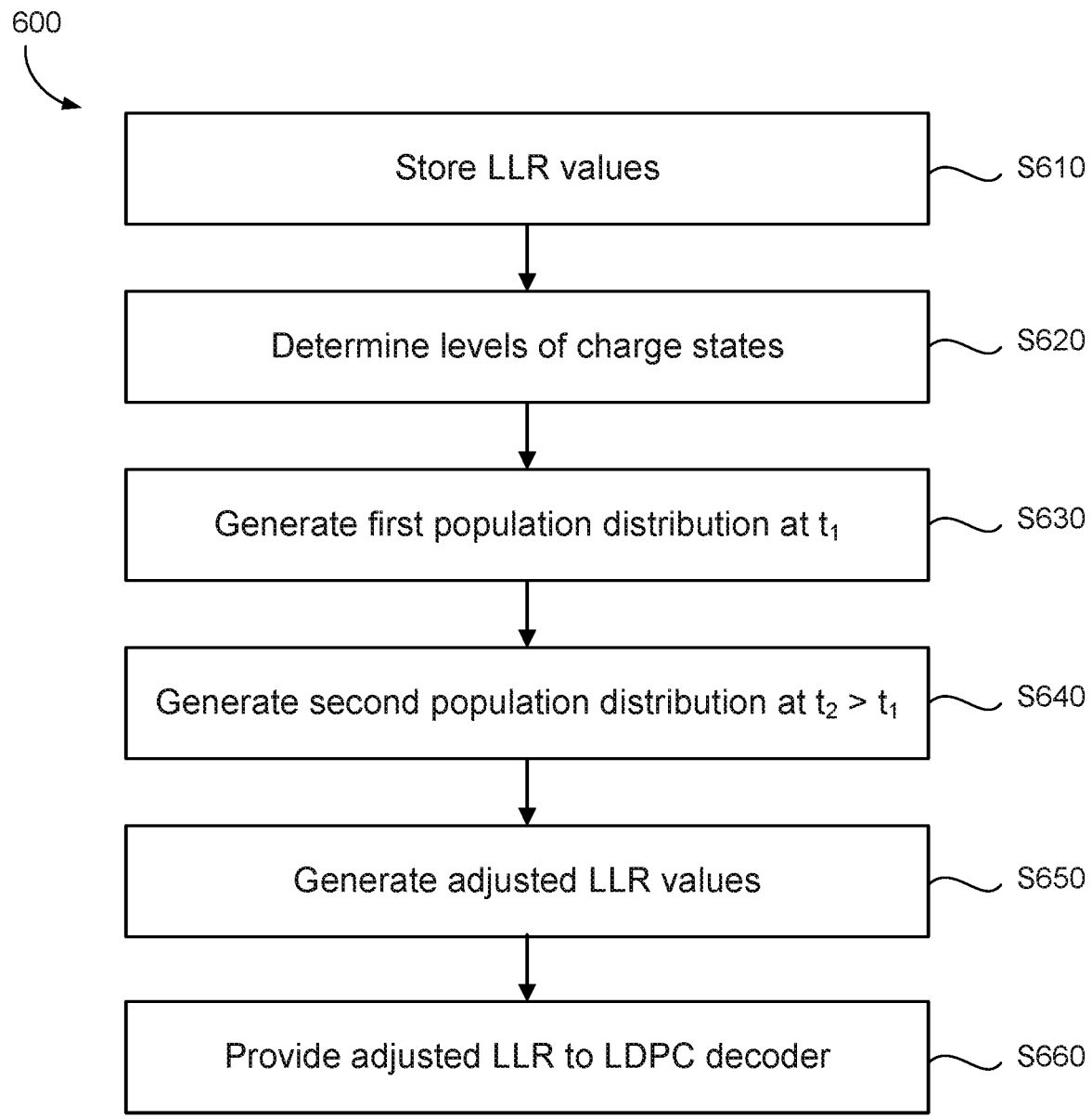
FIG. 6 illustrates a flow diagram of providing an adjusted LLR value to a low-density parity check (LDPC) decoder, according to one or more embodiments of the present disclosure.

A method of soft decision LDPC decoding using adjusted LLR values will now be described in relation to FIG. 6. The method 600 begins at step S610 in which LLR values for the memory cells in a memory array are stored in the memory controller. As previously mentioned, an LLR LUT may be stored in the LLR generator of the controller. The method then progresses to step S620 where the voltage levels of the charge states of the cells in which the bits of the codeword are stores are determined. A translation circuit within the memory controller determines the levels of the cells as illustrated in FIGS. 2G and 2H as detailed above. In step S630, the controller generates a first population distribution of the levels of the charge states in the memory cells at a first time period. At a second time period after the first time period, the controller generates a second population distribution of the levels of the charge states (step S640). In step S650, adjusted LLR values are determined based on analyzing and comparing the first and second population distributions. Finally, the adjusted LLR values are provided to the LDPC decoder for soft decoding.

Figure 7:
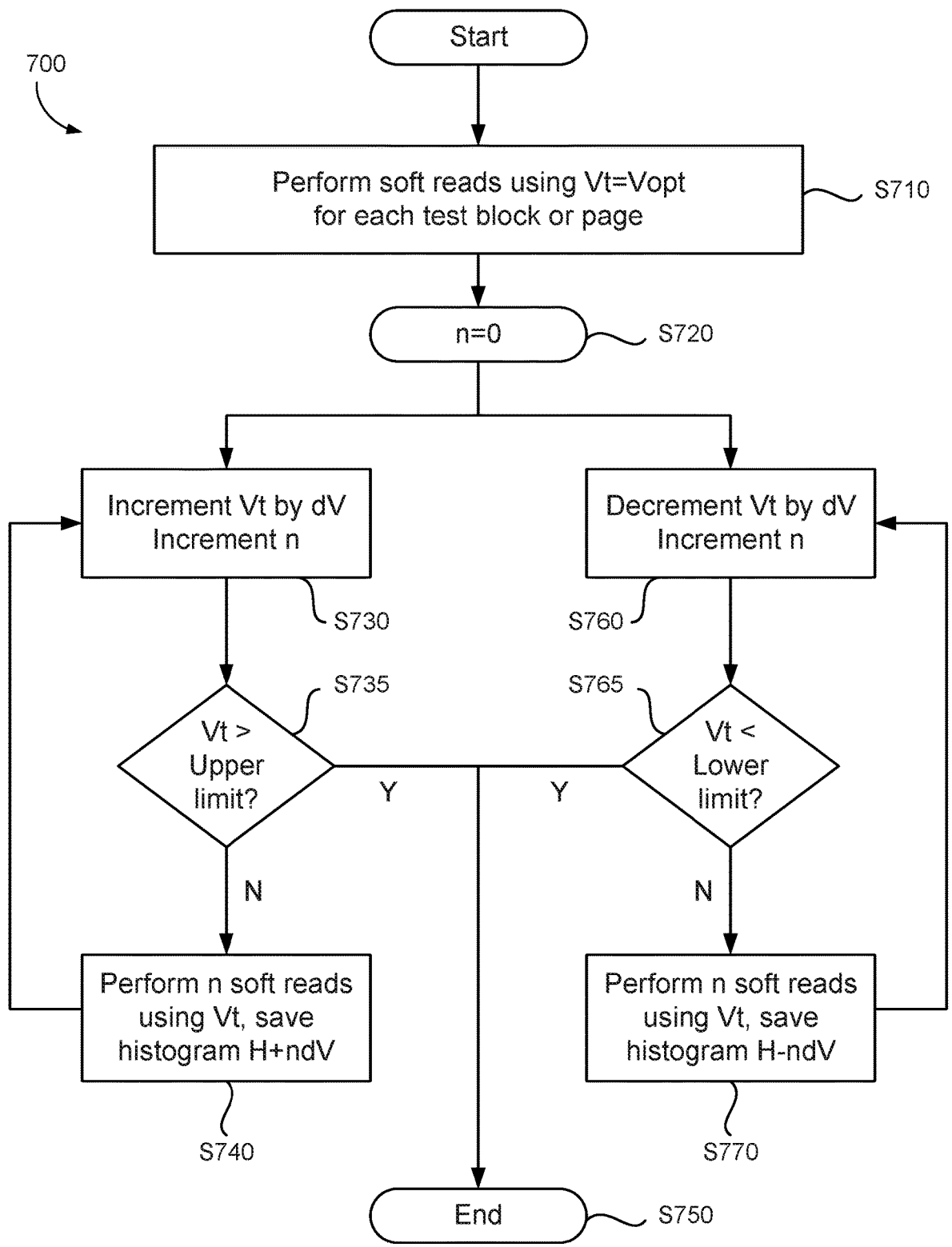
FIG. 7 illustrates a flow diagram of characterizing a memory, according to one or more embodiments of the present disclosure.

A method of characterizing a memory to derive the relationship between shifts in read voltage thresholds and histograms of population distribution of charge states in the memory will now be described in relation to FIG. 7. The method 700 begins at step S710 where, for each block or block/page combination chosen for characterization, a set of soft reads are performed around the optimum voltage threshold and a histogram HOPT of the population distribution of the charge states in the memory cells is saved. In step S720 a counter n is set to 0. The method then performs two loops (which may be performed in parallel as shown, or sequentially). At Step 730, the read voltage threshold is incremented by a small delta voltage, dV. The value of dV may be chosen according to the required accuracy of estimation of shifts in threshold voltage that are required to be determined and may be the same as the quantization step previously mentioned. The counter n is also incremented. At step S735, if the read threshold voltage has not exceeded an upper limit, the method proceeds to Step S740. At step S740, for each block or block/page combination chosen for characterization, a set of soft reads are performed around the optimum voltage threshold and the histogram H+ndV of the population distribution of the charge states in the memory cells is saved. The method then returns to Step S730. As the loop proceeds, a series of histograms H+1dV, H+2dV, H+3dV etc. are collected for n=1, 2, 3 . . . , until the value of Vt=Vopt+ndV exceeds an upper limit set. If the read threshold voltage has exceeded an upper limit, the method of characterization ends (step S750).

At Step S760 (right hand loop), the read voltage threshold is decremented by the small delta voltage, dV. The counter n is also incremented. At step S765, if the read threshold voltage has not gone below a lower limit, the process proceeds to Step S770. If the read threshold voltage has gone below a lower limit, the method of characterization ends (step S750). At step S770, for each block block/page combination chosen for characterization, a set of soft reads are performed around the optimum voltage threshold and the histogram H−ndV of the population distribution of the charge states in the memory cells is saved. As the loop proceeds, a series of histograms H−1dV, H−2dV, H−3dV etc. are collected until the value of Vt=Vopt−ndV goes below a lower limit set. The method therefore collects a series of histograms at a series of read voltage thresholds which vary from VOPT−ndV (lower limit) through VOPT to VOPT+ndV (Upper limit) in steps of dV.

Figure 8:
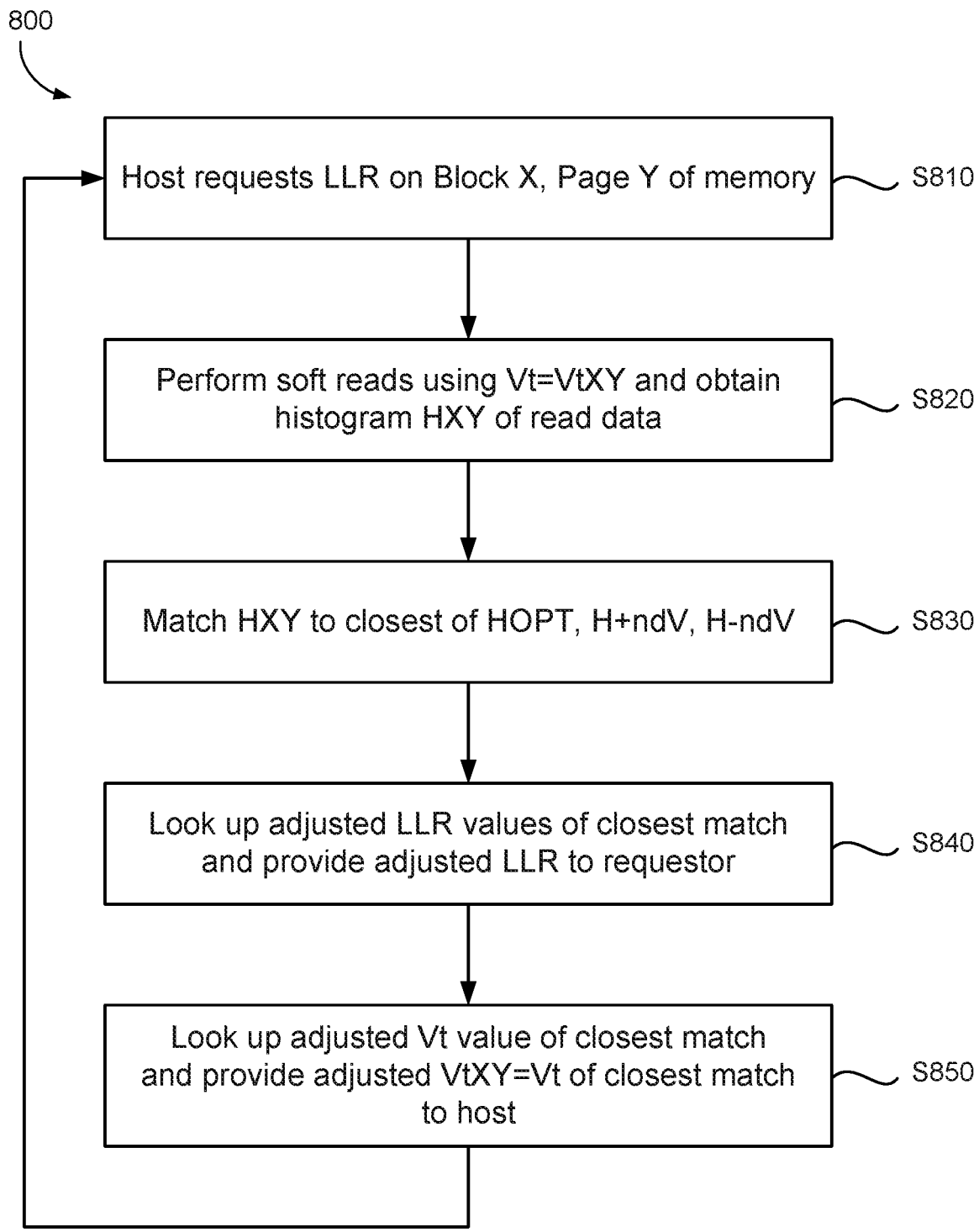
FIG. 8 illustrates a flow diagram of reading data from a memory, and adjusting LLR values and read voltage thresholds of the memory, according to one or more embodiments of the present disclosure.

A method by which data may be read from the memory and adjustments made to both LLR values and read voltage threshold as a result of characterizing a memory will now be described in relation to FIG. 8. The method 800 begins with Step S810 with a request from a host to provide adjusted LLR values and/or an adjusted read voltage threshold for a page Y on a memory block X (for example in order to provide the LDPC decoder with the adjusted LLR values or to adjust the read voltage threshold being used to read the memory page Y or memory pages in block X). At Step S820 a set of soft reads are performed around the current read voltage threshold Vt=VXY and the histogram HXY of the population distribution of the charge states in the memory cells is saved. At Step S830 a closest histogram of a series collected during characterization (H−ndV, HOPT, H−ndV) is matched to HXY. At Step S840, the adjusted LLR values of the matching histogram are determined (for example, using a look up table) and provided to the host (to be provided to the LDPC decoder). At Step S850, an adjusted read voltage threshold corresponding to the matching histogram is determined (for example, using a look up table) and provided to the host. The method then returns to step S810 to wait for the next host request.

The foregoing is merely illustrative of the principles of the disclosure, and the apparatuses can be practiced by other than the described implementations, which are presented for purposes of illustration and not of limitation. Variations and modifications will occur to those of skill in the art after reviewing this disclosure. The disclosed features may be implemented, in any combination and sub-combination (including multiple dependent combinations and sub-combinations), with one or more other features described herein. The various features described or illustrated above, including any components thereof, may be combined or integrated in other systems. Moreover, certain features may be omitted or not implemented.

Examples of changes, substitutions, and alterations are ascertainable by one skilled in the art and could be made without departing from the scope of the information disclosed herein. All references cited herein are incorporated by reference in their entirety and made part of this application.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

The invention claimed is:

1. A method of providing one or more adjusted log likelihood ratio (LLR) values of a plurality of bits in a codeword to a low-density parity check (LDPC) decoder, the plurality of bits representing a plurality of charge states of a plurality of memory cells of a non-volatile memory, the method comprising:
storing in a non-volatile memory controller communicatively coupled to the non-volatile memory one or more LLR values associated with the plurality of bits;
determining, by translation circuitry, a plurality of levels of the plurality of charge states represented by the plurality of bits;
generating, by a distribution processor,
a first distribution of a population of the plurality of levels at a first time, and
a second distribution of the population of the plurality of levels at a second time after the first time;
generating, by an LLR generator, the one or more adjusted LLR values of the plurality of bits based on a comparison between the first and second distributions; and
decoding, by the LDPC decoder, the codeword according to the one or more adjusted LLR values.

2. The method of claim 1, wherein the comparison comprises:
determining a minimum population in each of the first and second distributions, and the associated level at each minimum population;
determining a difference between the associated levels for the first and second distributions; and
determining a corrected LLR value for each bit in the codeword that minimizes the difference.

3. The method of claim 1, wherein the one or more LLR values are stored in a first look up table (LUT), and wherein the one or more adjusted LLR values are stored in a second LUT.

4. The method of claim 1, wherein the first and second distributions comprise cumulative population distributions.

5. The method of claim 1, wherein the level is a threshold voltage level associated with a charge state of a cell of the non-volatile memory.

6. The method of claim 2, wherein the difference between the associated levels for the first and second distributions corresponds to a change in read threshold voltage of the cells of the non-volatile memory.

7. The method of claim 1, wherein determining the cell charge state of a cell comprises performing multiple reads on each cell at varying threshold voltages.

8. The method of claim 1, wherein the plurality of cell charge states and their associated numerical levels are stored in the non-volatile memory controller.

9. The method of claim 1, wherein the level of a cell varies according to the cell charge state of plurality of cells.

10. The method of claim 1, wherein the level of a cell varies according to a length of time since the cell was programmed with charge.

11. The method of claim 1, wherein the level of a cell varies according to a total number of read cycles or program and erase cycles the target cell has been subjected to.

12. The method of claim 3, wherein the LLR values stored in the first and second LUTs are predetermined.

13. The method of claim 1, wherein the non-volatile memory comprises any one of: single level cells (SLCs), multi-level cells (MLCs), triple level cells (TLCs) and quadruple level cells (QLCs).

14. The method of claim 1, wherein the plurality of cells of the non-volatile memory is capable of being in any one of two, four, eight or sixteen cell charge states.

15. A non-volatile memory controller for adjusting one or more log likelihood ratio (LLR) values of a plurality of bits in a codeword for low-density parity check (LDPC) decoding, the plurality of bits representing a plurality of charge states of a plurality of memory cells of a non-volatile memory, the controller comprising:
storing circuitry configured to store one or more LLR values of the at least one bit;
translation circuitry configured to determine a plurality of levels of the plurality of charge states represented by the plurality of bits;
a distribution processor configured to:
generate a first distribution of a population of the plurality of levels at a first time; and
generate a second distribution of the population of the plurality levels at a second time after the first time;
an LLR generator configured to generate the one or more adjusted LLR values of the plurality of bits based on a comparison between the first and second distributions; and
an LDPC decoder configured to decode the codeword using the one or more adjusted LLR values.

16. The controller of claim 15, wherein the distribution processor is also configured to:
determine a minimum population in each of the first and second distributions, and the associated level at each minimum population; and
determine a difference between the associated levels for the first and second distributions, and wherein the LLR generator is configured to determine a corrected LLR value for each bit in the codeword that minimizes the difference.

17. The controller of claim 15, wherein the LLR generator is configured to store the one or more LLR values in a first look up table (LUT), and wherein the LLR generator is also configured to store the one or more adjusted LLR values in a second LUT.

18. The controller of claim 15, wherein the first and second distributions comprise cumulative population distributions.

19. The controller of claim 15, wherein the level is a threshold voltage level associated with a charge state of a cell of the non-volatile memory.

20. The controller of claim 16, wherein the difference between the associated levels for the first and second distributions corresponds to a change in threshold voltage of the cells of the non-volatile memory.

21. The controller of claim 15, wherein determining the cell charge state of a cell comprises performing multiple reads on each cell at varying threshold voltages.

22. The controller of claim 15, wherein the plurality of cell charge states and their associated numerical levels are stored in the non-volatile memory controller.

23. The controller of claim 15, wherein the level of a cell varies according to the cell charge state of plurality of cells.

24. The controller of claim 15, wherein the level of a cell varies according to a length of time since the cell was programmed with charge.

25. The controller of claim 15, wherein the level of a cell varies according to a total number of program and erase cycles the target cell has been subjected to.

26. The controller of claim 17, wherein the LLR values stored in the first and second LUTs are predetermined.

27. The controller of claim 15, wherein the non-volatile memory comprises any one of: single level cells (SLCs), multi-level cells (MLCs), triple level cells (TLCs) and quadruple level cells (QLCs).

28. The controller of claim 15, wherein the plurality of cells of the non-volatile memory is capable of being in any one of two, four, eight or sixteen cell charge states.

* * * * *